United States Patent
Dhar et al.

(10) Patent No.: US 9,189,583 B2
(45) Date of Patent: Nov. 17, 2015

(54) LOOK-UP BASED BUFFER TREE SYNTHESIS

(71) Applicant: Synopsys, Inc., Mountain View, CA (US)

(72) Inventors: Sanjay Dhar, Lake Oswego, OR (US);
Kok Kiong Lee, Sunnyvale, CA (US);
Sanjay V. Kumar, Fremont, CA (US);
Prashant Saxena, Portland, OR (US);
Robert L. Walker, Boulder, CO (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 14/139,590

(22) Filed: Dec. 23, 2013

(65) Prior Publication Data

US 2014/0181765 A1 Jun. 26, 2014

Related U.S. Application Data

(60) Provisional application No. 61/746,071, filed on Dec. 26, 2012, provisional application No. 61/765,587, filed on Feb. 15, 2013.

(51) Int. Cl.
*G06F 17/50* (2006.01)

(52) U.S. Cl.
CPC .................................. *G06F 17/505* (2013.01)

(58) Field of Classification Search
CPC ...... G06F 1/10; G06F 17/505; G06F 17/5068
USPC .......... 716/104–108, 110–114, 126, 132, 134
See application file for complete search history.

(56) References Cited

U.S. PATENT DOCUMENTS

| 5,402,356 | A | * | 3/1995 | Schaefer et al. | 716/104 |
|---|---|---|---|---|---|
| 7,137,081 | B2 | | 11/2006 | Alpert et al. | |
| 7,412,680 | B1 | | 8/2008 | Gouterman et al. | |
| 8,024,693 | B2 | | 9/2011 | Adams et al. | |
| 8,146,039 | B2 | | 3/2012 | Shah et al. | |
| 2004/0064793 | A1 | * | 4/2004 | Alpert et al. | 716/2 |
| 2004/0210857 | A1 | * | 10/2004 | Srinivasan | 716/2 |

* cited by examiner

*Primary Examiner* — Paul Dinh
(74) *Attorney, Agent, or Firm* — Park, Vaughan, Fleming & Dowler LLP; Laxman Sahasrabuddhe (57) ABSTRACT

Systems and techniques are described for performing buffer tree synthesis. Some embodiments create a lookup table based on information contained in a cell library. The lookup table is then used during buffer tree synthesis.

18 Claims, 4 Drawing Sheets

Receive a source node and a set of sink nodes
402

Construct the buffer tree by recursively performing the following operations by starting from the set of sink nodes and progressively moving toward the source node: (a) form one or more clusters by grouping one or more nodes together; (b) determine a capacitive load for each cluster; (c) perform a table lookup based on the capacitive load to obtain an optimal size of a buffer or an inverter and an optimal spacing; and (d) place the buffer or the inverter of the optimal size at one or more locations in the buffer tree based on the optimal spacing.
404

| NLDM 204 | IT1 | IT2 | IT3 | | ITm |
|---|---|---|---|---|---|
| OL1 | (OD11,OT11) | (OD12,OT12) | (OD13,OT13) | | (OD1m,OT1m) |
| OL2 | (OD21,OT21) | (OD22,OT22) | (OD23,OT23) | | (OD2m,OT2m) |
| OL3 | (OD31,OT31) | (OD32,OT32) | (OD33,OT33) | | (OD3m,OT3m) |
| ⋮ | | | | | |
| OLn | (ODn1,OTn1) | (ODn2,OTn2) | (ODn3,OTn3) | | (ODnm,OTnm) |

LOOK-UP BASED BUFFER TREE SYNTHESIS

RELATED APPLICATION

This application claims priority to the following U.S. Provisional Patent Applications: (1) U.S. Provisional Patent Application No. 61/746,071, entitled "Universal lookup based buffering technique that applies to data path, clock tree, flat, hierarchical, and mixed hierarchical buffering," by the same inventors, filed on 26 Dec. 2012, the contents of which are herein incorporated by reference in their entirety for all purposes, and (2) U.S. Provisional Patent Application No. 61/765,587, entitled "Look-up based fast logic synthesis," by inventors Yiu-Chung Mang, Sanjay Dhar, Vishal Khandelwal, and Kok Kiong Lee, filed on 15 Feb. 2013, the contents of which are herein incorporated by reference in their entirety for all purposes.

The subject matter of this application is related to the subject matter of U.S. Non-Provisional patent application Ser. No. 14/068,253 entitled "Look-up based fast logic synthesis," filed on 31 October 2013, the contents of which are herein incorporated by reference in their entirety for all purposes.

BACKGROUND

1. Technical Field

This disclosure relates to buffer tree synthesis. More specifically, this disclosure relates to look-up based buffer tree synthesis.

2. Related Art

Advances in semiconductor technology presently make it possible to integrate hundreds of millions of transistors onto a single semiconductor chip. This dramatic increase in semiconductor integration densities has made it considerably more challenging to design circuits.

Some circuit synthesis approaches use an ad hoc approach to synthesize buffer trees. Specifically, in these approaches, non-optimal buffer trees are constructed during synthesis for high fan-out nets. Then, during delay optimization, buffers or inverters are added to the buffer tree in an ad hoc fashion to satisfy timing constraints. Unfortunately, such ad hoc buffer tree synthesis approaches often produce poor quality results. Therefore, what are needed are systems and techniques for buffer tree synthesis that do not have the above-mentioned drawbacks.

SUMMARY

Some embodiments disclose systems and techniques for performing buffer tree synthesis. Specifically, some embodiments create a lookup table, and then use the lookup table during buffer tree synthesis.

Some embodiments can perform buffer tree synthesis using the lookup table as follows. An embodiment, e.g., a computer system, can receive a source node and a set of sink nodes. Next, the system can construct the buffer tree by recursively performing the following operations by starting from the set of sink nodes and progressively moving toward the source node: (a) form one or more clusters by grouping one or more sink nodes together; (b) determine a capacitive load for each cluster; (c) perform a table lookup based on the capacitive load to obtain an optimal size of a buffer or an inverter and an optimal spacing between buffers or inverters; and (d) place the buffer or the inverter of the optimal size at one or more locations in the buffer tree based on the optimal spacing. In some embodiments, placing the buffer or the inverter involves routing wires in a routing grid while avoiding routing blockages. In some embodiments, placing the buffer or the inverter involves determining locations that avoid all placement blockages.

For a given capacitive load, the lookup table can return an optimal buffer or inverter size and an optimal spacing. In some embodiments, the lookup table can be created as follows. For each capacitive load under consideration, the system can (a) determine a cost metric for each buffer or inverter in a set of buffers or inverters; (b) identify one or more buffers or inverters that have optimal or near optimal cost metrics for the capacitive load and determine an optimal spacing for each identified buffer or inverter; and (c) associate the capacitive load with the one or more identified buffers or inverters and the corresponding optimal spacing. In some embodiments, the cost metric is a combination of two or more terms, wherein the two or more terms include at least an area of the buffer or inverter and a delay of the buffer or inverter.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein. In this disclosure, when the term "and/or" is used with a list of entities, it refers to all possible combinations of the list of entities. For example, the phrase "X, Y, and/or Z" covers the following cases: (1) only X; (2) only Y; (3) only Z; (4) X and Y; (5) X and Z; (6) Y and Z; and (7) X, Y, and Z. Additionally, in this disclosure, the term "based on" means "based solely or partially on."

Overview of an Electronic Design Automation (EDA) Flow

An EDA flow can be used to create a circuit design. Once the circuit design is finalized, it can undergo fabrication, packaging, and assembly to produce integrated circuit chips. An EDA flow can include multiple steps, and each step can involve using one or more EDA software tools. Some EDA steps and software tools are described below. These examples of EDA steps and software tools are illustrative purposes only and are not intended to limit the embodiments to the forms disclosed.

Some EDA software tools enable circuit designers to describe the functionality that they want to implement. These tools also enable circuit designers to perform what-if planning to refine functionality, check costs, etc. During logic design and functional verification, the HDL (hardware description language), e.g., SystemVerilog, code for modules in the system can be written and the design can be checked for functional accuracy, e.g., the design can be checked to ensure that it produces the correct outputs.

During synthesis and design for test, the HDL code can be translated to a netlist using one or more EDA software tools. Further, the netlist can be optimized for the target technology, and tests can be designed and implemented to check the finished chips. During netlist verification, the netlist can be checked for compliance with timing constraints and for correspondence with the HDL code.

During design planning, an overall floorplan for the chip can be constructed and analyzed for timing and top-level routing. During physical implementation, circuit elements can be positioned in the layout (placement) and can be electrically coupled (routing).

During analysis and extraction, the circuit's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. During mask data preparation, the design can be "taped-out" to produce masks which are used during fabrication.

In the following discussion, we first explain how delays are typically stored in a cell library. Next, we describe how a lookup table can be created for buffer tree synthesis. Then, we describe some embodiments for performing look-up based buffer tree synthesis.

Cell Library

A technology library or a cell library is a collection of library cells (e.g., buffers and inverters) of one or more library cell types. The term "library cell type" or "cell type" refers to the behavior of a cell. For example, an "OR" cell type can refer to cells that perform a logical "OR" operation. The term "library cell" or "cell" refers to a particular implementation of a library cell type. For example, a technology library may include multiple sizes of an inverter. In this example, the term "inverter" is the library cell type, and the term "library cell" refers to an inverter implementation of a particular size.

Figure 1:
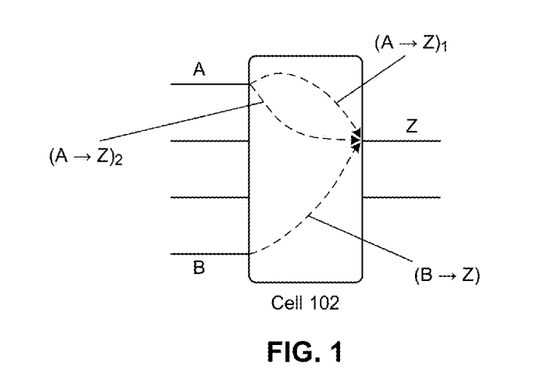
FIG. 1 illustrates a library cell in accordance with some embodiments described herein.

FIG. 1 illustrates a library cell in accordance with some embodiments described herein. Library cell 102 has a set of inputs and a set of outputs. A signal path within library cell 102 from an input to an output is called a library arc. One or more library arcs may exist between an input and an output of a library cell. For example, two library arcs exist between input A and output Z, which are shown as $(A \rightarrow Z)_1$ and $(A \rightarrow Z)_2$ in the figure. Only one library arc exists between input B and output Z which is shown as $(B \rightarrow Z)$ in the figure. The delay behavior for each library arc can be different. Furthermore, for a given library arc, the delay behavior for a rising output transition can be different from the delay behavior for a falling output transition. In complex library cells like multiplexors, the difference in the delay characteristics for different library arcs and for rising/falling output transitions can be significant. The term "library arc group" is used in this disclosure to refer to equivalent library arcs across different library cells. For example, a library arc group can include the library arcs of multiple "OR" cells in a cell library that all begin at the top input of an "OR" gate and end at the output of the "OR" gate.

The term "non-linear delay model," or "NLDM" for short, is used in this disclosure to refer to a discretized delay model that models cell delay. A discretized delay model is a model in which the delay behavior is represented using a set of discrete data points of delay behavior. Specifically, a discretized delay model, e.g., an NLDM, can be viewed as a set of points in a multi-dimensional space that includes an output loading dimension, an input transition (i.e., slew) dimension, an output delay dimension, and an output transition dimension. In some implementations, multiple NLDMs exist for each library arc of each library cell, e.g., different NLDM models can be used for modeling the delay for a rise-rise, a rise-fall, a fall-rise, or a fall-fall transition.

Figure 2A:
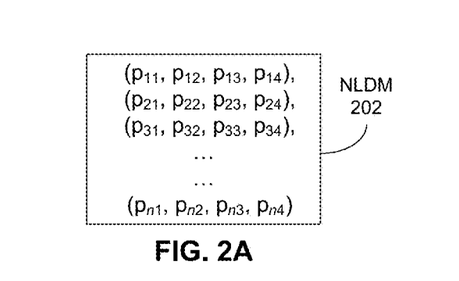
FIG. 2A illustrates how an NLDM can be viewed as a set of points in a four dimensional space in accordance with some embodiments described herein.

FIG. 2A illustrates how an NLDM can be viewed as a set of points in a four dimensional space in accordance with some embodiments described herein. NLDM 202 has n points, each represented as a tuple of four elements. The elements in the tuple represent the values in the four dimensions. For example, $p_{11}$ can be a particular output loading value, $p_{12}$ can be a particular input transition value, $p_{13}$ can be a particular output delay value, and $p_{14}$ can be a particular output transition value. This point can represent one data point in the library cell's delay behavior: if the output load on an output "OUT" of a library cell is equal to $p_{11}$ and the library cell receives an input signal on an input "IN" with an input transition $p_{12}$, then the library cell produces an output signal on output "OUT" after a delay $p_{13}$ with an output transition $p_{14}$.

Figure 2B:
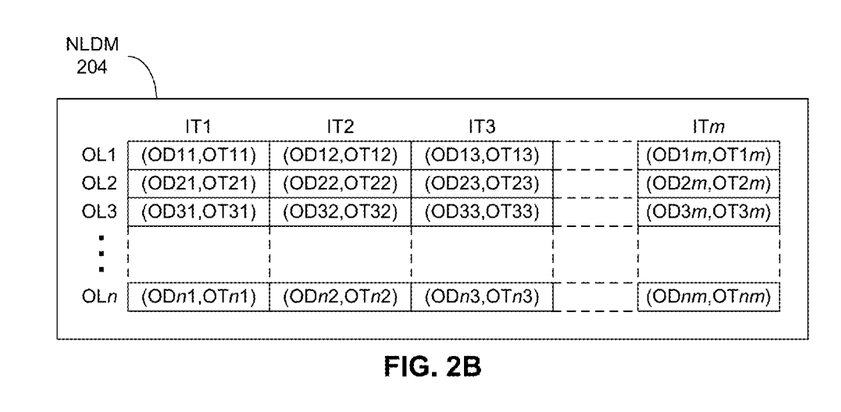
FIG. 2B illustrates how an NLDM can be viewed as a two dimensional table in accordance with some embodiments described herein.

FIG. 2B illustrates how an NLDM can be viewed as a two dimensional table in accordance with some embodiments described herein. NLDM 204 can be represented as a two dimensional table, wherein each element in the table is a tuple of two values. Each row in the table corresponds to a particular output loading value: OL1, OL2, . . . , OLn. Each column in the table corresponds to a particular input transition value: IT1, IT2, . . . , ITm. Each element in the table is a tuple of the output delay value and the output transition value. For example, the tuple (OD32, OT32) is a tuple of the output delay value OD32 and the output transition value OT32 that corresponds to the output loading value OL3 and input transition value IT2.

The two dimensional table shown in FIG. 2B can be used to look up the output delay and output transition value for a given output loading and input transition value. Note that each element in the two dimensional table corresponds to a point in a four dimensional space. For example, the element (OD32, OT32) corresponds to the point (OL3, IT2, OD32, OT32).

Since the NLDM is a discretized delay model, it can be made arbitrarily accurate by increasing the number of points in the model that are used to represent the delay behavior. Many existing technology libraries provide accurate NLDMs for all library arcs of all the library cells.

Lookup Table

Figure 3:
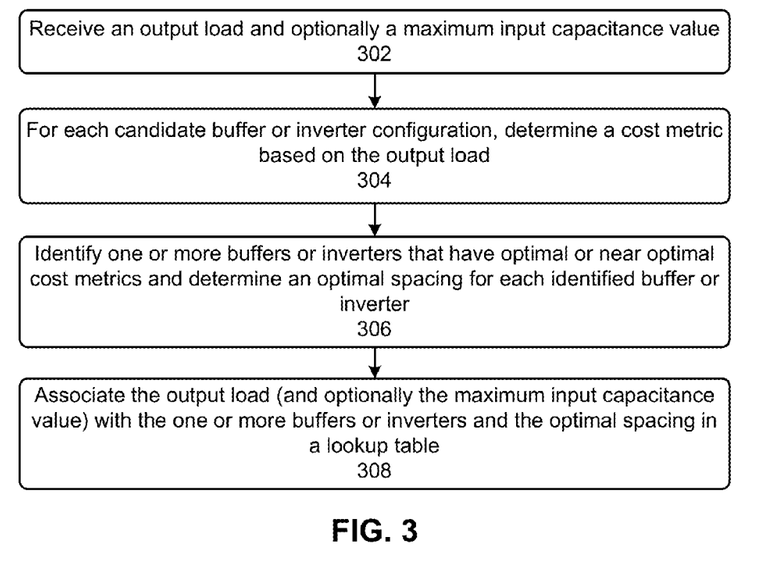
FIG. 3 illustrates a process for creating a load-based lookup table from a cell library in accordance with some embodiments described herein.

FIG. 3 illustrates a process for creating a load-based lookup table from a cell library in accordance with some embodiments described herein. The term "lookup table" as used in this disclosure generally refers to any data structure that is capable of storing an association between two or more entities (e.g., two or more columns or data fields), and that allows look ups to be performed based on one or more entities (e.g., one or more columns or data fields). The process can begin by receiving an output load and optionally a maximum input capacitance value (operation 302). Note that the maximum input capacitance value is optional, i.e., some embodiments do not use the maximum input capacitance value as an input. Next, for each candidate buffer or inverter, the process can determine a cost metric based on the output load (operation 304). In embodiments that use the maximum input capacitance value, the candidate buffers or inverters include only those buffer or inverters whose input capacitance is less than or equal to the maximum input capacitance value. In embodiments that do not use the maximum input capacitance value, all buffers and inverters regardless of their input capacitance values are considered in operation 304.

In some embodiments, the cost metric is a combination of multiple terms associated with the buffer or inverter that can include, but are not limited to, area, delay, and power leakage. Specifically, in some embodiments, the cost metric is a weighted sum (or a non-linear combination) of the area of the buffer or inverter and the delay of the buffer or inverter for the given output load.

In some embodiments, the output loads at which the optimal buffers and inverters are computed and stored in the lookup table are spaced apart in a geometric series. For example, the output loads can be 0, L, $\alpha$L, $\alpha^2$L, etc., where L is a nominal output load value, and $\alpha$ is a constant greater than 1. Recall that the delay of a library arc depends on the input transition and the output load. In some embodiments, the input transition value is assumed to be a nominal input transition value, or is assumed to be within a narrow range of input transition values.

Some embodiments can compute the nominal input transition value as follows. The total delay of a buffer chain (i.e., a sequence of buffers that are serially coupled to form a chain of buffers) is referred to as the insertion delay of the buffer chain. The library is assumed to contain enough buffers of different sizes so that the buffers are approximately continuously sizable. For a buffer B driving a load L with input transition time t, let $transition_B(t, L)$ and $delay_B(t, L)$ be the output transition time at the output of the buffer B and the delay through B, respectively (e.g., these values can be obtained from the NLDM for the buffer). The gain g of the buffer is defined as L/C where C is the input capacitance of the buffer B. According to the logical effort theory, to minimize insertion delay, each buffer in the buffer chain should have the same gain g. Such a buffer chain can be modeled as a buffer tree that (1) is rooted at the same leftmost buffer as the buffer chain, (2) has g times as many buffers in the next level as in the current level, and (3) has the same number of levels as the buffer chain.

Thus, the buffer chain insertion problem has been reduced to the following problem: given a load L, the buffer B and the level N is computed for the buffer tree rooted at the buffer B such that the insertion delay of the buffer tree is minimized. For a buffer B with input capacitance C and a gain g, a transition delay t is selected such that both the input and output transition times of B are equal to t (i.e., $t=transition_B(t, gC)$). For a buffer chain driving a load L, the number of levels N of buffers required is N=log(L/C)/log(g) (because each level has gain g, and the total gain is equal to L/C), and the insertion delay is therefore $insDelay_B(L,g)=N \cdot delay_B(t,gC)$.

Since the delay function of the buffer B is convex in the parameter g, the insertion delay function $insDelay_B$ is also convex in g. Hence, a minimum value for the insertion delay exists. In some embodiments, some or all buffers in the buffer library are iterated through and the buffer B* is chosen so that B* gives the minimum insertion delay, wherein the associated gain of B* is g*. Note that the buffer B* and gain g* are independent of the size of the load L, and as a result, the same buffer and gain can be used for all different loads. The nominal transition delay t* can then be chosen so that $t*=transition_B*(t*, g*, C*)$. This nominal transition delay can be used in the embodiments described herein.

As mentioned above, some embodiments receive a maximum input capacitance value in operation 302. In these embodiments, operation 304 only considers those buffers or inverters in which the input capacitance value is less than (and optionally equal to) the maximum input capacitance value. The maximum input capacitance value can be used to ensure that the input capacitance of the buffer or inverter is less than a given maximum value.

Once the cost metrics have been computed for the buffers or inverters, the process then identifies one or more buffers or inverters that have optimal or near optimal cost metrics and determines an optimal spacing for each identified buffer or inverter (operation 306). For example, the optimal cost metric can be defined as the minimum cost metric in a set of cost metrics, and cost metrics that are within a range (defined in terms of an absolute value or a percentage) of the optimal cost metric can be considered to be near optimal cost metric values. For each buffer or inverter that was identified in operation 306, an optimal spacing can be determined by determining the largest wire distance between two adjacent buffers or inverters that minimizes the end-to-end delay through the chain of buffers and inverters without violating the maximum slew constraint. Next, the process associates the output load (and optionally the maximum input capacitance value) with the one or more buffers or inverters (that were identified in operation 306) and the optimal spacing in a lookup table (operation 308). Once the lookup table has been created, one or more optimal buffers or inverters (and the corresponding optimal spacing) for a given output load value can be quickly determined by performing a table lookup using the output load value (and optionally the maximum input capacitance value).

In embodiments in which a maximum input capacitance value is provided, the process uses two input values—namely the output load and the maximum input capacitance—to look up the optimal or near optimal buffers and/or inverters and the corresponding optimal spacing. Alternatively, multiple lookup tables can be created, wherein each lookup table corresponds to a particular maximum input capacitance value. The process of selecting a discrete buffer or inverter based on a lookup value is called "discretization" and is described in further detail below.

Process for Performing Look-Up Based Buffer Tree Synthesis

Figure 4:
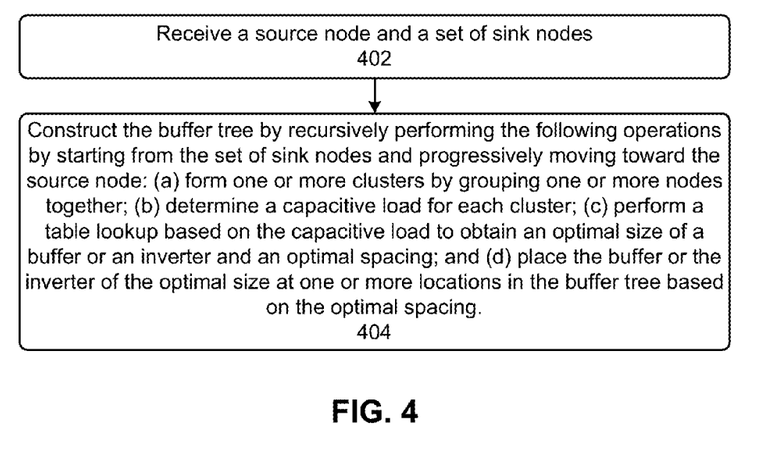
FIG. 4 illustrates a process for synthesizing a buffer tree in accordance with some embodiments described herein.

FIG. 4 illustrates a process for synthesizing a buffer tree in accordance with some embodiments described herein. The process can begin with receiving a source node and a set of sink nodes (operation 402). Once constructed, the buffer tree will electrically connect the source node with the set of sink nodes. The process illustrated in FIG. 4 can be used for constructing buffer trees during clock tree synthesis (e.g., for electrically connecting a source clock pin with clock input pins of registers) or in the data path (e.g., for electrically connecting a data output pin of a driver gate with the data input pins of a set of gates).

The process can then construct the buffer tree by recursively performing the following operations by starting from the set of sink nodes and progressively moving toward the source node: (a) form one or more clusters by grouping one or more sink nodes together; (b) determine a capacitive load for each cluster; (c) perform a table lookup based on the capacitive load to obtain an optimal size of a buffer or an inverter and an optimal spacing; and (d) place the buffer or the inverter of the optimal size at one or more locations in the buffer tree based on the optimal spacing (operation 404).

Note that the lookup table stores optimal and/or near optimal buffers or inverters for a set of discrete output loads. Therefore, given an output load, some embodiments can discretize the output load by determining the discrete output load in the lookup table that is closest to the given output load (this corresponds to a "rounding" function). Other embodiments can determine the greatest discrete output load that is less than the given output load (this corresponds to a "floor" function). Yet other embodiments can determine the smallest discrete output load that is greater than the given output load (this corresponds to a "ceiling" function).

In some embodiments, the process can electrically connect the pins by routing wires in a routing grid while avoiding routing blockages. A chip typically includes one or more metal layers on which wires can be routed to electrically connect circuit elements. Each metal layer usually has a preferred routing direction. A routing blockage is an area in the routing grid where wires are not allowed to be routed. Routing blockages may be vertically blocked (i.e., a vertical wire is not allowed to be routed) and/or horizontally blocked (i.e., a horizontal wire is not allowed to be routed). Also, routing blockages may be defined only on certain routing layers of the chip but routing may be allowed on other routing layers. Once the wires have been routed, the wire lengths for driving the pins can be determined. The wire lengths can then be used to determine the number and locations of buffers or inverters that need to be placed. For example, if the table lookup operation indicates that the optimal spacing between two buffers is equal to 3 length units, and the length of one of the wires in the routing solution is equal to 9 length units, then a total of 3 buffers can be placed on that wire with a spacing of 3 length units.

In some embodiments, determining the location for placing the buffer or the inverter involves determining a location that is not in any placement blockage (a placement blockage is an area in the circuit design where a buffer or inverter cannot be placed). When the process determines a location to place the buffer or the inverter, the process may adjust the determined location and/or select a different buffer or inverter to make sure that the location where the buffer or inverter is placed is not in any of the placement blockages.

Figure 5:
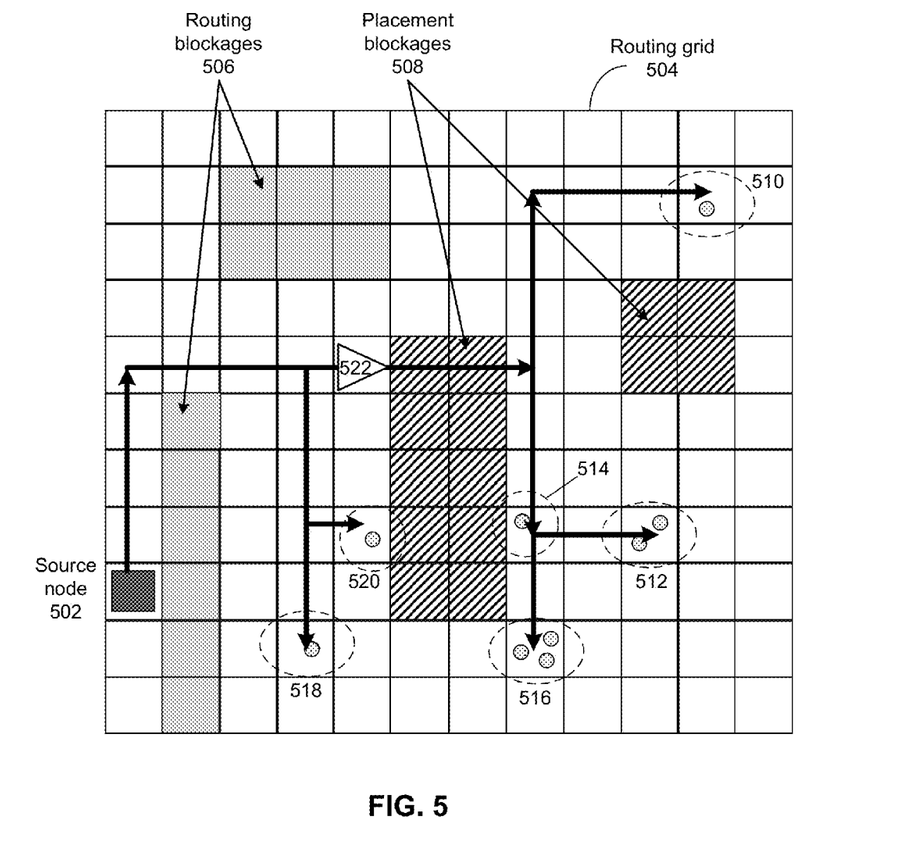
FIG. 5 illustrates an example of buffer tree synthesis in accordance with some embodiments described herein.

FIG. 5 illustrates an example of buffer tree synthesis in accordance with some embodiments described herein. A buffer tree needs to be constructed to electrically connect output pin of source node 502 to a set of sink nodes (each sink node can correspond to a data input pin or a clock input pin) that are shown as small shaded circles in FIG. 5. Routing grid 504 can be used to route wires of the buffer tree. Routing blockages 506 and placement blockages 508 can be specified in routing grid 504. Some embodiments can cluster sink nodes into one or more clusters. For example, as shown in FIG. 5, the set of sink nodes can be clustered into clusters 510, 512, 514, 516, 518, and 520, and wires can be routed (while taking into consideration routing blockages 506) to electrically connect source node 502 to the sink nodes. Next, the capacitive load of each cluster can be determined (e.g., by summing up of all input pin capacitances of the sink nodes that are in a given cluster), and then the capacitive load can be used to perform a table lookup to determine the optimal buffer or inverter size and the optimal spacing. Some embodiments can then place the optimal sized buffer or inverter at the appropriate location (e.g., by taking into consideration placement blockages 508) in the buffer tree based on the optimal spacing. For example, some embodiments may decide to place buffer 522 in the buffer tree.

Computer System

Figure 6:
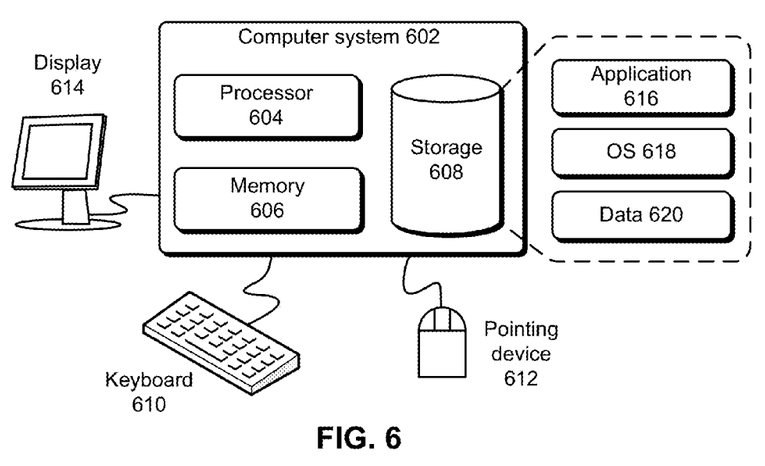
FIG. 6 illustrates a computer system in accordance with some embodiments described herein.

FIG. 6 illustrates a computer system in accordance with some embodiments described herein. A computer or a computer system can generally be any system that can perform computations. Specifically, a computer system can be a microprocessor, an application specific integrated circuit, a distributed computing system, a cloud computing system, or any other computing system now known or later developed. Computer system 602 comprises processor 604, memory 606, and storage 608. Computer system 602 can be coupled with display 614, keyboard 610, and pointing device 612. Storage 608 can generally be any device that can store data. Specifically, a storage device can be a magnetic, an optical, or a magneto-optical storage device, or it can be based on flash memory and/or battery-backed up memory. Storage 608 can store application 616, operating system 618, and data 620.

Application 616 can include instructions that when executed by computer 602 cause computer 602 to perform one or more processes that are implicitly or explicitly described in this disclosure. Data 620 can include any data that is inputted into or outputted by application 616.

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a non-transitory computer-readable storage medium and/or a hardware module and/or hardware apparatus. A non-transitory computer-readable storage medium includes all computer-readable storage mediums with the sole exception of a propagating electromagnetic wave or signal. Specifically, a non-transitory computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a non-transitory computer-readable storage medium or device, so that when a computer system reads and executes the code and/or data, the computer system performs the associated methods and processes. The methods and processes can also be partially or fully embodied in hardware modules or apparatuses. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. In an electronic design automation (EDA) software tool, a method for synthesizing a buffer tree, the method comprising:
    receiving a source node and a set of sink nodes; and
    constructing the buffer tree by recursively performing at least the following operations by starting from the set of sink nodes and progressively moving toward the source node:
        forming one or more clusters by grouping one or more sink nodes together;
        determining a capacitive load for each cluster;
        performing a table lookup on a lookup table based on the capacitive load to obtain an optimal size of a buffer or an inverter and an optimal spacing, wherein the lookup table associates capacitive load values with corresponding optimal buffer or inverter sizes and optimal spacing values; and
        placing the buffer or the inverter of the optimal size at one or more locations in the buffer tree based on the optimal spacing.

2. The method of claim 1, wherein said placing the buffer or the inverter involves routing wires in a routing grid while avoiding routing blockages.

3. The method of claim 1, wherein said placing the buffer or the inverter involves determining locations that avoid all placement blockages.

4. The method of claim 1, further comprising analyzing a cell library to create a lookup table that returns, for a given capacitive load, an optimal buffer or inverter size and an optimal spacing.

5. The method of claim 4, wherein said analyzing the cell library includes, for each capacitive load under consideration,
    determining a cost metric for each buffer or inverter in a set of buffers or inverters;
    identifying one or more buffers or inverters that have optimal or near optimal cost metrics for the capacitive load and determining an optimal spacing for each identified buffer or inverter; and
    associating the capacitive load with the one or more identified buffers or inverters and the corresponding optimal spacing.

6. The method of claim 5, wherein the cost metric is a combination of two or more terms, wherein the two or more terms include at least an area of the buffer or inverter and a delay of the buffer or inverter.

7. A non-transitory computer-readable storage medium storing instructions of an electronic design automation (EDA) software tool that, when executed by a computer, cause the computer to perform a method for synthesizing a buffer tree, the method comprising:
    receiving a source node and a set of sink nodes; and
    constructing the buffer tree by recursively performing at least the following operations by starting from the set of sink nodes and progressively moving toward the source node:
        forming one or more clusters by grouping one or more sink nodes together;
        determining a capacitive load for each cluster;
        performing a table lookup on a lookup table based on the capacitive load to obtain an optimal size of a buffer or an inverter and an optimal spacing, wherein the lookup table associates capacitive load values with corresponding optimal buffer or inverter sizes and optimal spacing values; and
        placing the buffer or the inverter of the optimal size at one or more locations in the buffer tree based on the optimal spacing.

8. The non-transitory computer-readable storage medium of claim 7, wherein said placing the buffer or the inverter involves routing wires in a routing grid while avoiding routing blockages.

9. The non-transitory computer-readable storage medium of claim 7, wherein said placing the buffer or the inverter involves determining locations that avoid all placement blockages.

10. The non-transitory computer-readable storage medium of claim 7, further comprising analyzing a cell library to create a lookup table that returns, for a given capacitive load, an optimal buffer or inverter size and an optimal spacing.

11. The non-transitory computer-readable storage medium of claim 10, wherein said analyzing the cell library includes, for each capacitive load under consideration,
    determining a cost metric for each buffer or inverter in a set of buffers or inverters;
    identifying one or more buffers or inverters that have optimal or near optimal cost metrics for the capacitive load and determining an optimal spacing for each identified buffer or inverter; and
    associating the capacitive load with the one or more identified buffers or inverters and the corresponding optimal spacing.

12. The non-transitory computer-readable storage medium of claim 11, wherein the cost metric is a combination of two or more terms, wherein the two or more terms include at least an area of the buffer or inverter and a delay of the buffer or inverter.

13. An apparatus, comprising:
    a processor; and
    a non-transitory storage medium storing instructions of an electronic design automation (EDA) software tool that, when executed by the processor, cause the computer to perform a method for synthesizing a buffer tree, the method comprising:
        receiving a source node and a set of sink nodes; and
        constructing the buffer tree by recursively performing at least the following operations by starting from the set of sink nodes and progressively moving toward the source node:
            forming one or more clusters by grouping one or more sink nodes together;
            determining a capacitive load for each cluster;
            performing a table lookup on a lookup table based on the capacitive load to obtain an optimal size of a buffer or an inverter and an optimal spacing, wherein the lookup table associates capacitive load values with corresponding optimal buffer or inverter sizes and optimal spacing values; and
            placing the buffer or the inverter of the optimal size at one or more locations in the buffer tree based on the optimal spacing.

14. The apparatus of claim 13, wherein said placing the buffer or the inverter involves routing wires in a routing grid while avoiding routing blockages.

15. The apparatus of claim 13, wherein said placing the buffer or the inverter involves determining locations that avoid all placement blockages.

16. The apparatus of claim 13, wherein the method further comprises analyzing a cell library to create a lookup table that returns, for a given capacitive load, an optimal buffer or inverter size and an optimal spacing.

17. The apparatus of claim 16, wherein said analyzing the cell library includes, for each capacitive load under consideration,     determining a cost metric for each buffer or inverter in a set of buffers or inverters;

identifying one or more buffers or inverters that have optimal or near optimal cost metrics for the capacitive load and determining an optimal spacing for each identified buffer or inverter; and     associating the capacitive load with the one or more identified buffers or inverters and the corresponding optimal spacing.

18. The apparatus of claim 17, wherein the cost metric is a combination of two or more terms, wherein the two or more terms include at least an area of the buffer or inverter and a delay of the buffer or inverter.

* * * * *